United States Patent
Ho et al.

(10) Patent No.: US 8,168,507 B2
(45) Date of Patent: May 1, 2012

(54) STRUCTURE AND METHOD OF FORMING ENHANCED ARRAY DEVICE ISOLATION FOR IMPLANTED PLATE EDRAM

(75) Inventors: Herbert L. Ho, Hopewell Junction, NY (US); Naoyoshi Kusaba, Hopewell Junction, NY (US); Karen A. Nummy, Hopewell Junction, NY (US); Carl J. Radens, Hopewell Junction, NY (US); Ravi M. Todi, Hopewell Junction, NY (US); Geng Wang, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 137 days.

(21) Appl. No.: 12/545,116

(22) Filed: Aug. 21, 2009

(65) Prior Publication Data

US 2011/0042731 A1   Feb. 24, 2011

(51) Int. Cl.
*H01L 21/20* (2006.01)
(52) U.S. Cl. ......... 438/386; 438/589; 257/E21.158; 257/E21.646
(58) Field of Classification Search ............ 438/386, 438/589; 257/E21.158, E21.646
See application file for complete search history.

(56) References Cited

U.S. PATENT DOCUMENTS

| | | | |
|---|---|---|---|
| 5,804,851 A * | 9/1998 | Noguchi et al. | 257/304 |
| 6,020,250 A * | 2/2000 | Kenney | 438/422 |
| 6,551,898 B1 | 4/2003 | Hughes et al. | |
| 6,734,063 B2 | 5/2004 | Willer et al. | |
| 7,067,402 B2 | 6/2006 | Matsumura et al. | |
| 7,122,439 B2 * | 10/2006 | Kwon et al. | 438/386 |
| 2003/0038323 A1 * | 2/2003 | Kotani | 257/347 |
| 2006/0051945 A1 | 3/2006 | Yokokawa et al. | |
| 2006/0281233 A1 | 12/2006 | Aoki et al. | |
| 2007/0057307 A1 | 3/2007 | Shum et al. | |

OTHER PUBLICATIONS

Lee, Jong_Wook, et al.—Hot-Carrier Degradation Behavior of Thin-Film SOI nMOSFET with Isolation Scheme and Buried Oxide Thickness.—IEEE Transactions on Electron Devices, vol. 47, No. 5—May 2000.

* cited by examiner

*Primary Examiner* — Alexander Ghyka
*Assistant Examiner* — Stanetta Isaac
(74) *Attorney, Agent, or Firm* — Scully, Scott, Murphy & Presser, P.C.; Wenjie Li (57) ABSTRACT

A method for forming a memory device in a semiconductor on insulator substrate is provided, in which a protective oxide that is present on the sidewalls of the trench protects the first semiconductor layer, i.e., SOI layer, of the semiconductor on insulator substrate during bottle etching of the trench. In one embodiment, the protective oxide reduces back channel effects of the transistors to the memory devices in the trench that are formed in the semiconductor on insulator substrate. In another embodiment, a thermal oxidation process increases the thickness of the buried dielectric layer of a bonded semiconductor on insulator substrate by oxidizing the bonded interface between the buried dielectric layer and at least one semiconductor layers of the semiconductor on insulator substrate. The increased thickness of the buried dielectric layer may reduce back channel effects in devices formed on the substrate having trench memory structures.

8 Claims, 6 Drawing Sheets

STRUCTURE AND METHOD OF FORMING ENHANCED ARRAY DEVICE ISOLATION FOR IMPLANTED PLATE EDRAM

BACKGROUND

The present disclosure generally relates to the field of fabricating dynamic random access memory (DRAM) devices, such as embedded DRAM devices. Embedded DRAM devices may include trench capacitors. A trench capacitor is a three dimensional device formed by etching a trench into a semiconductor substrate. After trench etching, a buried plate electrode, also referred to as a diffusion plate, is typically formed about the exterior portion of the trench and a node dielectric is then formed on the inner walls of the trench. Next, the trench is filled, for example, with doped polysilicon, such as N-type polycrystalline silicon ("N-type Poly-Si"). The doped poly-Si serves as one electrode of the capacitor, often referred to as the upper electrode or storage node, and the buried plate electrode serves as a second electrode of the capacitor, often referred to as the lower electrode. A node dielectric separates the buried plate and the upper electrode and serves as the insulating layer of the trench capacitor.

SUMMARY

In one embodiment, a method of forming a memory device in a semiconductor on insulator (SOI) substrate is provided, in which an SOI layer, i.e., upper semiconductor layer (hereafter referred to as first semiconductor layer), of the SOI substrate is protected during the formation of the lower plate electrode. For example, the SOI layer may be protected during the formation of a lower plate electrode by forming an oxidized surface on the sidewall of the first semiconductor layer, e.g., an oxidized sidewall surface. In one embodiment, the method may begin with forming at least one dielectric layer (also referred to as pad dielectric stack) on an upper surface of an SOI substrate, in which the SOI substrate includes a first semiconductor layer overlying a buried dielectric layer, wherein the buried dielectric layer is present overlying a second semiconductor layer. The at least one dielectric layer has an opening that exposes a portion of the SOI substrate. In one embodiment, the exposed portion of the SOI substrate is anisotropically etched to expose at least a sidewall of the first semiconductor layer. Thereafter, the sidewall of the first semiconductor layer is laterally etched to provide a void underlying the at least one dielectric layer. In a following process step, the sidewall of the first semiconductor layer is oxidized to fill at least a portion of the void. A trench may then be formed into the second semiconductor layer extending from the first semiconductor layer through the dielectric layer and into at least a portion of the second semiconductor layer. In a following process step, at least one electrode is formed in a portion of the trench that is present in the second semiconductor layer.

In another aspect, a method is provided in which the buried dielectric layer of an SOI substrate is oxidized at an interface between the buried dielectric layer and at least one semiconductor layer of the SOI substrate to provide a buried dielectric layer having an increased thickness. Broadly, the method may begin with forming a SOI substrate by bonding, in which the SOI substrate includes a first semiconductor layer in direct contact with a first surface of a buried dielectric layer and a second semiconductor layer in direct contact with a second surface of the buried dielectric, in which a bonded interface is present between at least one of the buried dielectric layer and the first semiconductor layer and the buried dielectric layer and the second semiconductor layer. Following the formation of the bonded SOI substrate, a pad dielectric stack is formed on a surface of the first semiconductor layer that is opposing the surface of the first semiconductor layer that is in direct contact with the first surface of the buried dielectric layer, wherein the pad dielectric stack includes an opening exposing a portion the surface of the first semiconductor layer. Thereafter, the portion of the surface of the first semiconductor layer that is exposed by the opening in the pad dielectric stack is etched to provide an opening extending through the buried dielectric layer terminating on the second semiconductor layer. In a following process step, an oxidizing ambient forms a thermal oxide at the bonded interface of the SOI substrate. A trench is then formed in the second semiconductor layer extending from the opening in the pad dielectric stack, and a capacitor is formed within the trench.

In another aspect, a memory device is provided within a trench, wherein the memory device includes a lower electrode in the trench of an SOI substrate, in which the SOI layer, i.e., first semiconductor layer, of the semiconductor (SOI) substrate includes an oxidized portion that is present on the sidewall of the trench that is present in the semiconductor (SOI) substrate. Broadly, the memory device includes a SOI substrate including a first semiconductor layer atop a buried dielectric layer, wherein the buried dielectric layer is overlying a second semiconductor layer. The memory device also includes a capacitor that is present in a trench in the SOI substrate, wherein the trench extends from an upper surface of the first semiconductor layer through the buried dielectric layer into the second semiconductor layer, wherein a protective oxide is present on sidewalls of the trench at which the first semiconductor layer is present. The memory device further includes a pass transistor present atop the SOI substrate in electrical communication with the capacitor.

DESCRIPTION OF THE SEVERAL VIEWS OF THE DRAWINGS

The following detailed description, given by way of example and not intended to limit the invention solely thereto, will best be appreciated in conjunction with the accompanying drawings, wherein like reference numerals denote like elements and parts, in which:

FIGS. 7A-7C depict one embodiment of a memory structure produced from the structure depicted in FIG. 6, in accordance with one embodiment of the present invention. FIGS.

7A and 7B are side cross-sectional views.

DETAILED DESCRIPTION

Detailed embodiments of the present invention are disclosed herein; however, it is to be understood that the disclosed embodiments are merely illustrative of the invention that may be embodied in various forms. In addition, each of the examples given in connection with the various embodiments of the invention are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention.

The embodiments of the present invention relate to methods and structures relating to memory devices. When describing the methods, the following terms have the following meanings, unless otherwise indicated.

As used herein, the term "memory device" means a structure in which the electrical state thereof can be altered and then retained in the altered state; in this way a bit of information can be stored.

As used herein, "insulating" and "dielectric" denote a material having a room temperature conductivity of less than about $10^{10}(\Omega\text{-m})^{-1}$.

"Electrically conductive" and/or "electrical communication" as used through the present disclosure means a material having a room temperature conductivity of greater than $10^{-8}$ $(\Omega\text{-m})^{-1}$.

As used herein, a "metal" is an electrically conductive material, wherein metal atoms are held together by the force of a metallic bond, and the energy band structure of metal's conduction and valence bands overlap, and hence, there is no energy gap.

The term "undercut region" denotes a material removal that extends underneath an overlying structure.

As used herein, "conformal layer" is a deposited material having a thickness that remains the same regardless of the geometry of underlying features on which the layer is deposited, wherein the thickness of the layer does not deviate from greater than or less than 20% of an average value for the thickness of the layer.

As used herein, "conformally deposited" or "conformal deposition" refers to a deposition method for forming a conformal layer.

"Lateral etching" means that the material being etched is removed at a faster rate in the direction parallel to the upper surface of the semiconducting substrate, as opposed to the direction perpendicular to the semiconductor substrate.

As used herein, an "anisotropic etch process" denotes a material removal process in which the etch rate in the direction normal to the surface to be etched is much higher than in the direction parallel to the surface to be etched.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the invention, as it is oriented in the drawing figures.

In one embodiment, a method of forming a memory device in a semiconductor on insulator (SOI) substrate is provided, in which following formation of the trench, the exposed sidewall surfaces of the SOI layer are treated by an oxidation process to provide enhanced isolation of the pass transistors. For example, the oxidation process may effectively increase the thickness of the buried dielectric layer in the regions of the device in which the memory array is present. Further, the oxidation process forms a protective oxide surface on the SOI layer to protect the SOI layer during implantation steps that provide the lower gate electrode. In one example, the protective oxide also reduces back channel effects in the eDRAM trench devices.

Figure 1:
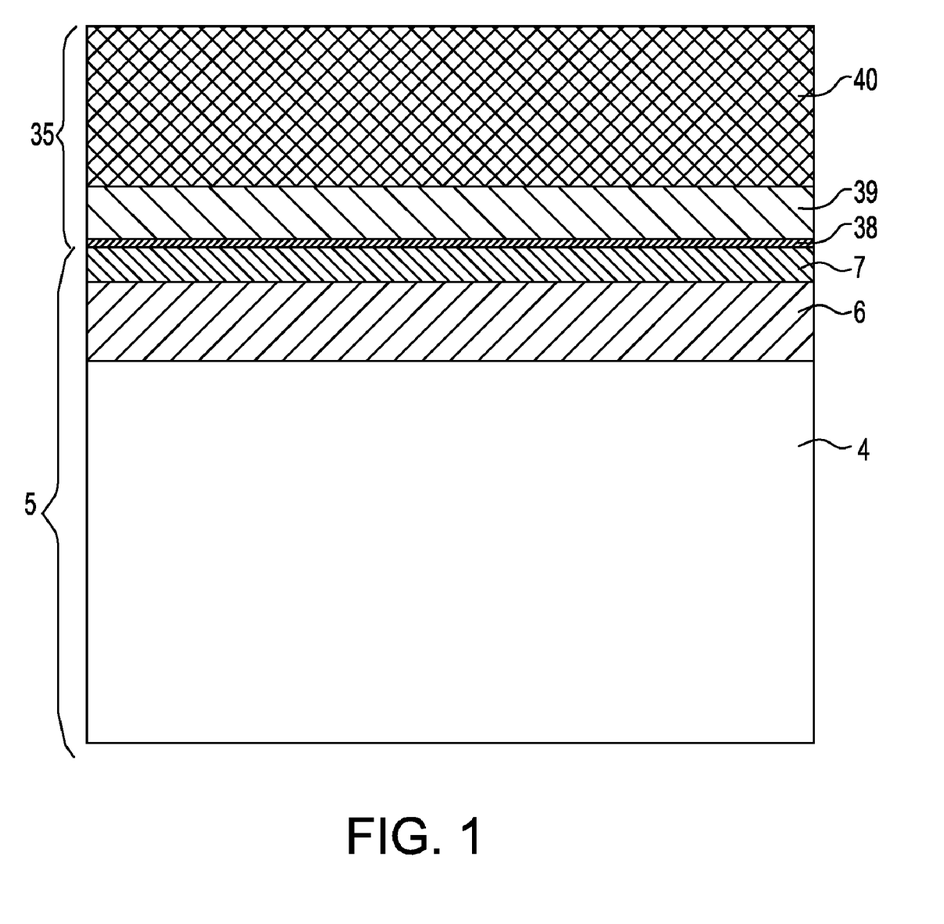
FIG. 1 is a side cross-sectional view depicting a semiconductor on insulator substrate (SOI) substrate having a pad dielectric stack disposed thereon, in accordance with the present invention.

FIG. 1 depicts a semiconductor substrate 5, e.g., SOI substrate, that may be used in accordance with one embodiment of the invention. In one example, at least one dielectric layer, e.g., pad dielectric stack 35, is present on an upper surface of the semiconductor substrate 5.

In the example depicted in FIG. 1, the semiconductor substrate 5 is a semiconductor on insulator (SOI) substrate including a first semiconductor layer 7 (also referred to as a semiconductor on insulator (SOI) layer), such as a silicon-containing semiconductor layer, located on a surface of a buried dielectric layer 6, such as a buried oxide layer. The first semiconductor layer 7 typically has a thickness greater than 10 nm. The buried dielectric layer 6 typically has a thickness ranging from 10 nm to 100 nm. In another embodiment, the buried dielectric layer 6 ranges from 20 nm to about 80 nm. Underlying the buried dielectric layer 6 is a lower semiconductor layer, i.e., second semiconductor layer 4, which may be composed of a Si-containing material, and may have a thickness ranging from 10 nm to 500 nm.

The first semiconductor layer 7 and/or the second semiconductor layer 4 may include any semiconductor material including, but not limited to: Si, Ge, SiGe, GaAs, InAs, InP, or other III/IV compounds. The first semiconductor layer 7 and/or the second semiconductor layer 4 may be doped with P or N-type dopants or may be undoped. In particular, the first semiconductor layer 7 and/or the second semiconductor layer 4 may be lightly doped with P-type dopants, such as boron. The first semiconductor layer 7 and/or the second semiconductor layer 4 may contain various isolation and/or active device regions. For clarity, such regions are not shown in the drawings, but are nevertheless meant to be included within the first semiconductor layer 7 and/or the second semiconductor layer 4. The buried dielectric layer 6 may be any dielectric material, such as an oxide, nitride or oxynitride. In one example, the buried dielectric layer is composed of silicon oxide.

The SOI substrate may be formed using a bonding process, or it may be formed using an ion implantation process. In one embodiment, the SOI substrate is a bonded substrate comprised of two semiconductor wafers that are bonded together. The two wafers used in fabricating the bonded substrate may include two SOI wafers, wherein one of the wafers includes the first semiconductor layer 7. One of the two wafers includes a dielectric layer present thereon, which is to be positioned between the first semiconductor layer 7 and the second semiconductor layer 4 to provide the buried dielectric layer 6 of the semiconductor (SOI) substrate. Bonding is achieved by first bringing the two wafers into intimate contact with other; optionally applying an external force to the contacted wafers; and then heating the two contacted wafers under conditions that are capable of bonding the two wafers together. The heating step may be performed in the presence or absence of an external force. In one embodiment, the heating step is typically performed in an inert ambient at a temperature of from 600° to 1300° C. for a time period of from 2 to 20 hours. In another embodiment, the bonding is performed at a temperature of from 900° to 1200° C. for a time period of from 2 hours to 20 hours. The term "inert ambient" is used herein to denote an atmosphere in which an inert gas, such as He, Ar, $N_2$, Xe, Kr or a mixture thereof, is employed. The interface between the bonded structures, i.e., bonding interface, is typically characterized as having a plurality of voids that result in a weakened bonding interface. The voids typically have a diameter ranging from 5 nm to 50 nm. In one example, the voids have a diameter ranging from 20 nm to 40 nm.

Although the semiconductor substrate 5 depicted in FIG. 1 is an SOI substrate, the semiconductor substrate 5 may be a bulk Si substrate on which a dielectric layer has been deposited followed by a semiconductor layer. In this embodiment, the deposited dielectric layer is substituted for the buried dielectric layer 6, and the deposited semiconductor layer is substituted for the first semiconductor layer 7.

The pad dielectric stack 35 includes at least one dielectric layer. The pad dielectric stack 35 may be formed on the surface of the semiconductor substrate 5 using deposition and/or thermal growth processes. The pad dielectric stack 35 can serve as an etch mask during formation of at least one trench 10 in the semiconductor substrate 5. The pad dielectric stack 35 may comprise a single pad dielectric layer, or the pad dielectric stack 35 may comprise a multilayered structure. For example, the dielectric stack 35 may comprise an oxide, a nitride, or a doped silicate glass material, or two or more of the aforementioned materials may be employed.

In the example depicted in FIG. 1, the pad dielectric stack 35 includes a first pad dielectric layer 38, e.g., a pad oxide layer, a second pad dielectric layer 39, e.g., a pad nitride layer, and a third pad dielectric layer 40, e.g., a high density plasma (HDP) chemical vapor deposition (CVD) deposited oxide. When the first pad dielectric layer 38 is composed of a pad oxide layer, the pad oxide layer may be silicon oxide having a thickness ranging from 1 nm to 10 nm, typically being 5 nm. When the second pad dielectric layer 39 is composed of a pad nitride layer, the pad nitride layer may be silicon nitride having a thickness ranging from 10 nm to 100 nm. When the third pad dielectric layer 40 is composed of HDPCVD oxide, the HDPCVD oxide may be silicon oxide having a thickness ranging from 10 nm to 500 nm.

Following the formation of the pad dielectric stack 35 on the surface of semiconductor substrate 5, the pad dielectric stack 35 is then patterned using conventional lithography and etching. A photolithographic mask (not shown) is produced, by applying a photoresist layer (not shown) on the exposed surface layer of the surface to be etched utilizing a conventional deposition process. The photoresist layer is then patterned utilizing conventional lithography so as to expose selective regions of the pad stack in which trenches are to be formed. The lithography step employed in the present invention includes exposing the photoresist to radiation to form a pattern in the photoresist and developing the pattern. The pattern (not shown) is then transferred into the layer of the pad dielectric stack 35 using a conventional etching process, such as reactive-ion etching (RIE), ion beam etching, plasma etching or laser ablation that is highly selective in removing pad material as compared to photoresist.

Figure 2:
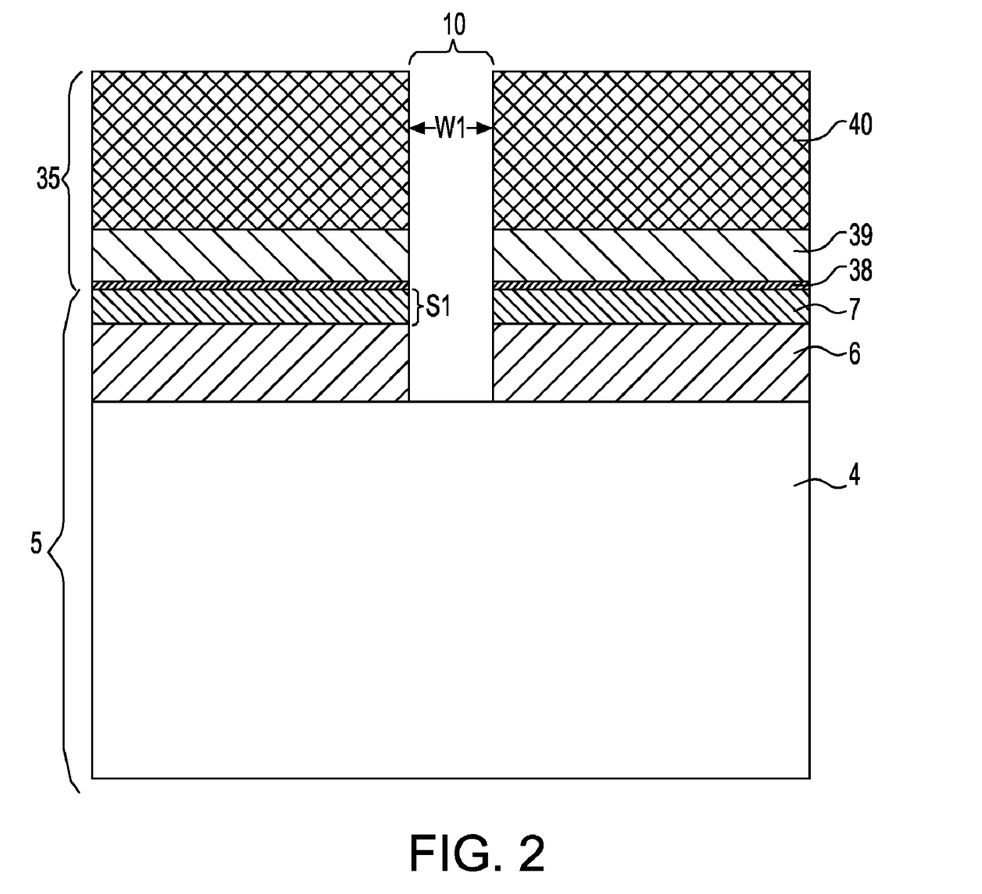
FIG. 2 is a side cross-sectional view depicting forming an opening in the pad dielectric stack, the SOI layer of the substrate, and the buried dielectric layer of the substrate, in accordance with one embodiment of the present invention.

FIG. 2 depicts forming at least one opening 10 through the pad dielectric stack 35 and the first semiconductor layer 7 and the buried dielectric layer 6 of the semiconductor substrate 5. In one embodiment, the opening 10 is first formed in the pad dielectric stack 35 to expose a portion, i.e., exposed portion, of the semiconductor substrate 5, i.e., SOI substrate. Thereafter, the exposed portion of the semiconductor substrate 5 is etched to expose at least a sidewall $S_1$ of the first semiconductor layer 7. Although, FIG. 2 depicts etching through the first semiconductor layer 7, i.e., semiconductor on insulator SOI layer, and the buried dielectric layer 6 stopping on the upper surface of the second semiconductor layer 4, embodiments have been contemplated where the opening 10 is provided by etching through the first semiconductor layer 7, i.e., SOI layer, and through the upper surface of the second semiconductor layer 4.

The opening 10 may be formed using an etch process, such as an anisotropic etch process. Etching of the at least one opening 10 into the first semiconductor layer 7 of the semiconductor substrate 5 may be performed using a timed etch process step that is highly selective in removing the material of the first semiconductor layer 7 of semiconductor substrate 5 as opposed to the material of the pad dielectric stack 35. Dry etching processes that may be used to form the at least one opening 10 include, but are not limited to: RIE, ion-beam etching, plasma etching or any other like dry etch process. A combination of the aforementioned dry etch processes may also be used in providing the at least one trench opening 10. In one embodiment, a first etch gas may remove the first semiconductor layer 7 selective to the buried dielectric layer 6, wherein a second etch gas may remove the buried dielectric layer 6 selective to the second semiconductor layer 4. The width $W_1$ of each opening 10 may range from 30 nm to 150 nm. More typically, the width $W_1$ of each opening 10 may range from 50 nm to 120 nm.

Figure 3:
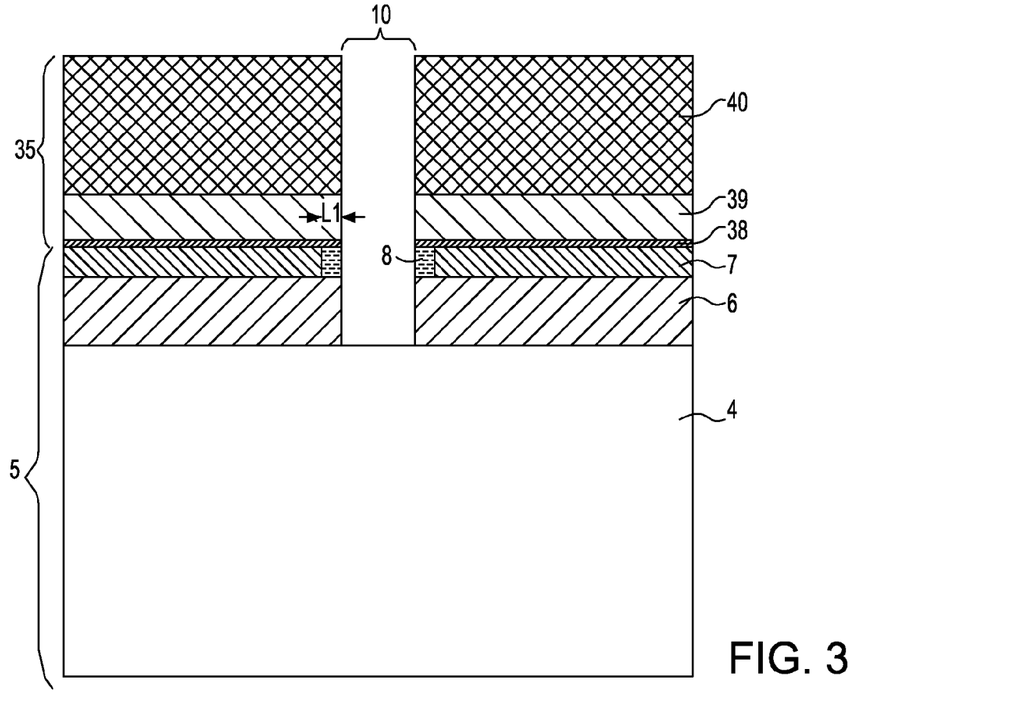
FIG. 3 is a side cross-sectional view depicting an SOI pullback process and oxidation of the SOI layer, in accordance with one embodiment of the present invention.

FIG. 3 depicts one embodiment of a lateral etch of the first semiconductor layer 7, e.g., SOI pullback process, and an oxidation of the portion of the first semiconductor layer 7 that is in closest proximity to the opening 10. In one embodiment, the lateral etch of the first semiconductor layer 7 is applied through the opening 10 to the sidewall (depicted in FIG. 2 by reference number 31) of the first semiconductor layer 7. The lateral etch may be provided by an isotropic etch, such as a wet etch having an etch selectivity for removing the first semiconductor layer 7 selective to the buried dielectric layer 6 and the pad dielectric stack 35.

In one embodiment, the laterally etching of the sidewall of the first semiconductor layer 7 provides a void, e.g., undercut region, underlying the pad dielectric stack 35, i.e., underlying at least one dielectric layer. In one embodiment, the void extends a dimension L1 ranging from 2 nm to 10 nm from the original sidewall of the opening 10 prior to the lateral etch process. In another embodiment, the void extends into the first semiconductor layer 7 from the original sidewall of the opening a dimension L1 ranging from about 3 nm to about 5 nm. It is noted that other dimensions for the undercut region have been contemplated and are within the scope of the present invention.

Following lateral etching and the formation of the void in the first semiconductor layer 7, an oxidation process is applied to the etched sidewall of the first semiconductor layer 7 to fill at least a portion of the void. In one embodiment, the oxidation process provides a protective oxide 8, e.g., thermal oxide, on the etched sidewall of the first semiconductor layer 7. In one embodiment, the protective oxide 8 fills the void in its entirety providing a sidewall that is substantially co-planar with the sidewall of the opening 10 that is formed through the pad dielectric stack 35 and the buried dielectric layer 6. In another embodiment, the protective oxide 8 does not fill the void in its entirety, hence providing a recess in the sidewall of the opening 10, or the protective oxide 8 extends beyond the positioning of the original sidewall of the first semiconductor layer 7 prior to lateral etching.

In addition to filling the void produced by the lateral etching of the first semiconductor layer 7, the oxidation process increases the thickness of the buried dielectric layer 6 of the semiconductor substrate 4. More specifically, the oxidation process effectuates oxide growth, e.g., thermal oxide growth, at the bonded interfaces of bonded SOI substrates between the buried dielectric layer 6, the first semiconductor layer 7 and the second semiconductor layer 4. In one embodiment, in which a bonded interface is present between the first semiconductor layer 7 and the buried dielectric layer 6, and a bonded interface is not present between the buried dielectric layer 6 and the second semiconductor layer 4, oxide growth is preferentially present at the bonded interface between the first semiconductor layer 7 and the buried dielectric layer 6. In another embodiment, in which a bonded interface is present between the second semiconductor layer 4 and the buried dielectric layer 6, and a bonded interface is not present between the buried dielectric layer 6 and the first semiconductor layer 7, oxide growth is preferentially present at the bonded interface between the second semiconductor layer 4 and the buried dielectric layer 6. In one embodiment, the oxidation process increases the thickness of the buried dielectric layer 6 by a dimension ranging from 50 Å to 250 Å. In another embodiment, the oxidation process increases the thickness of the buried oxide layer by a dimension ranging from 100 Å to 200 Å, typically being 150 Å. Although the oxidation process is depicted in FIG. 3 as being practiced in combination with the preceding lateral etch of the first semiconductor layer 7 of the semiconductor substrate 5, the oxidation process may be employed without the lateral etch process.

In one embodiment, the oxidation process is provided by a thermal anneal in an oxidative atmosphere. Typically, the thermal anneal is performed at a temperature from 1250° to 1350° C. for a time period from 4 to 6 hours. Other annealing temperatures and times are also contemplated herein so long as they are capable of oxidizing the etched sidewall of the first semiconductor layer 7. The thermal anneal can be performed utilizing various heating regimes, including a single ramp up step or multiple ramp up steps, with multiple soaking cycles. A single cool down step can be used, or multiple cool down steps, including multiple soaking cycles, can be used.

The thermal anneal can be performed in an oxidizing ambient that includes greater than 2 atomic percent $O_2$. In one example, the oxygen content of the oxidizing ambient ranges from 2 atomic percent $O_2$ to 5 atomic percent $O_2$. In one embodiment, the thermal anneal can be performed in an inert ambient such as He, Ne, Ar, Xe, Kr, $N_2$ or mixtures thereof. The oxidizing ambient can be admixed with one or more of the inert ambients mentioned above. In some embodiments of the present invention, a protective oxide 8 is formed on the laterally etched sidewall of the first semiconductor layer 7 when the anneal process is performed in oxidizing ambients at temperatures on the order of 1250° C. or greater.

The protective oxide 8 that is present on the etched sidewalls of the first semiconductor layer 7 protects the first semiconductor layer 7 from a subsequently performed isotropic etch, i.e., bottling etch, that increase the width of a subsequently formed trench in the second semiconductor layer 4.

Further, the protective oxide 8 that is present on the etched sidewalls of the first semiconductor layer 7 protects the first semiconductor layer 7 from a subsequently performed ion implantation that may form the lower electrode for a trench memory device. Additionally, the oxidation applied to the etched sidewalls of the first semiconductor layer 7 through the opening 10 of the pad dielectric stack 35 effectively increases the thickness of the buried dielectric layer 6, e.g., buried oxide (BOX) thickness, in an array region of the device without increasing the thickness of the buried dielectric layer 6 in the portion of the device in which the array is not present. In one embodiment, by increasing the thickness of the buried dielectric layer 6 in the array region of the device, the present invention may decrease backchannel sensitivity of the pass transistors to the trench memory devices.

The protective oxide 8, e.g., thermal oxide, formed on the etched sidewalls of the first semiconductor layer 7 provides improved isolation and improves the backchannel problem for eDRAM trench pass transistors by increasing the thickness of the buried dielectric layer in the eDRAM array only. Additionally, the oxide growth, e.g., thermal oxide growth, at the interface of the first semiconductor layer 7 and the buried dielectric layer 6 and/or the interface of the second semiconductor layer 4 and the buried dielectric layer 6 further increases the thickness of the buried dielectric layer 6. For the purposes of more clearly illustrating some aspect of the present method, without wishing to be limited solely thereto, in some embodiments the weak interface between the bonded layers of an SOI substrate that results from thermal bonding allows for oxidation of the bonding interface, which results in oxide growth and thickening of the buried dielectric layer 6.

Figure 4:
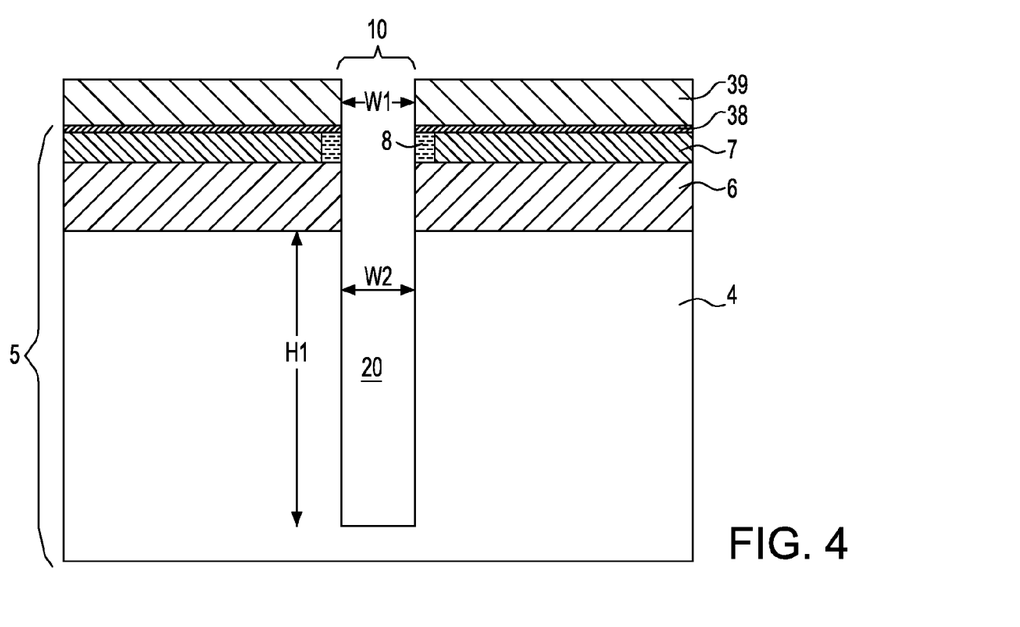
FIG. 4 is a side cross-sectional view depicting forming a trench in the lower semiconductor layer of the SOI substrate, in accordance with one embodiment of the present invention.

FIG. 4 depicts one embodiment of forming a trench 20 in the lower semiconductor layer, i.e., second semiconductor layer 4, of the semiconductor substrate 5. In one embodiment, the trench 20 is an extension of the opening 10 into the second semiconductor layer 4 of the semiconductor substrate 5. The trench 20 may be formed using an etch process, such as an anisotropic etch process, e.g., reactive ion etch (RIE). Etching of the trench 20 into the second semiconductor layer 4 of the semiconductor substrate 5 may be performed using a timed etch process step that is highly selective in removing the material of the second semiconductor layer 4 of semiconductor substrate 5 as opposed to the material of the pad dielectric stack 35. Dry etching processes that may be used to form the trench include, but are not limited to: RIE, ion-beam etching, plasma etching or any other like dry etch process. A combination of the aforementioned dry etch processes may also be used in providing the trench 20.

In one embodiment of the present invention, the final depth $H_1$ of each trench 10, as measured from the top surface of the second semiconductor layer 4 is as great as 10 μm. The final depth $H_1$ trench 20, as measured from the top surface of the second semiconductor layer 4 of the semiconductor substrate 5, may also range from 4 μm to 10 μm. The width $W_2$ at this stage of the process flow is typically the same as the width $W_1$ of the opening 10. In one example, the width $W_2$ of the trench 20 may range from 30 nm to 150 nm. In another example, the width $W_2$ of the trench 20 may range from 50 nm to 120 nm. The aspect ratio (height to width ratio) of the trench 20 may range from 25:1 to 100:1. Even more typically, the aspect ratio ranges from 30:1 to 70:1.

In one embodiment, the third pad dielectric 40 of the pad dielectric stack 35 may be removed by the etch process that produces the trench 20 to provide the structure depicted in FIG. 4. Alternatively, the third pad dielectric 40 of the patterned pad stack 35 is removed by a stripping process.

Figure 5:
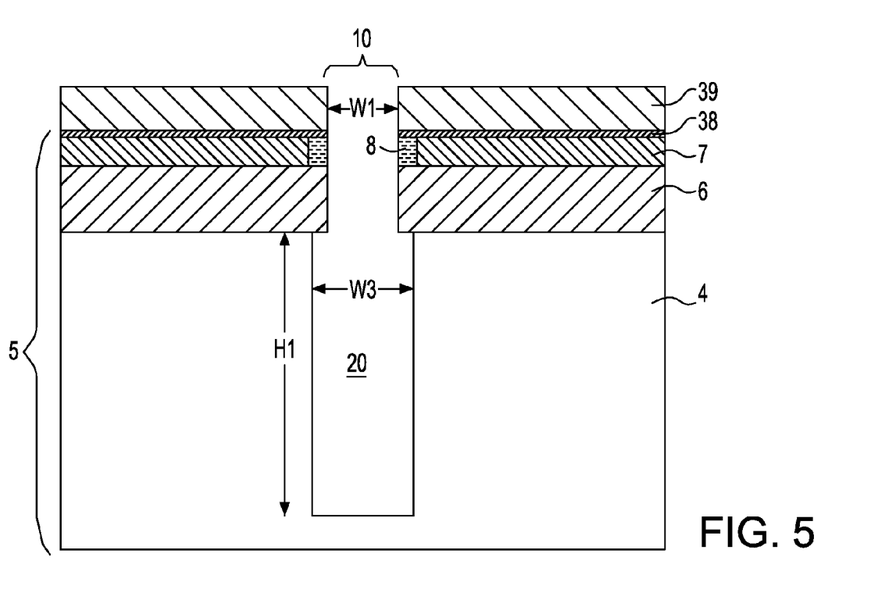
FIG. 5 is side cross-sectional views depicting laterally etching the trench, in accordance with one embodiment of the present invention.

FIG. 5 depicts isotropically etching the trench 20, in which the isotropic etch increases at least the width of the trench 20 in the second semiconductor layer 4. More specifically, the isotropic etch increases the width $W_1$ of the trench 20 provided by the anisotropic etch and opening 10 that is described with reference to FIG. 4 to an enlarged width $W_3$ as depicted in FIG. 5.

In one embodiment, the isotropic etch that provides the enlarged width $W_3$ in the trench 20 may be referred to as a "bottle etch", which provides a trench having a bottle-shape. Such bottle-shaped trenches can be formed by an isotropic etch process which selectively removes semiconductor material in the lower region of the trench 20 but not the upper region of the trench 20. In the present case, the isotropic etch removes the material of the second semiconductor layer 4 selective to the pad dielectric stack 35, the buried dielectric layer 6 and the protective oxide 8 that is present on the etched sidewalls of the first semiconductor layer 7.

In one embodiment, the second semiconductor layer 4 is isotropically etched with a buffered HF etch to obtain the bottle-shaped trench having an enlarged width $W_3$. In another embodiment, the second semiconductor layer 4 is isotropically etched to obtain a bottle-shaped trench having an enlarged width $W_3$. In one embodiment, the width $W_3$ of the trench 20 is enlarged to be greater than the width $W_1$ of the opening 10. In one example, the enlarged width $W_3$ of the trench 20 may range from 50 nm to 200 nm. In another example, the enlarged width $W_3$ of the trench 20 may range from 100 nm to 150 nm. As indicated above, in one embodiment, the protective oxide 8 protects the first semiconductor layer 7 from being damaged, i.e., substantially etched, by the isotropic etch that is used to enlarge the width of the trench 20.

Figure 6:
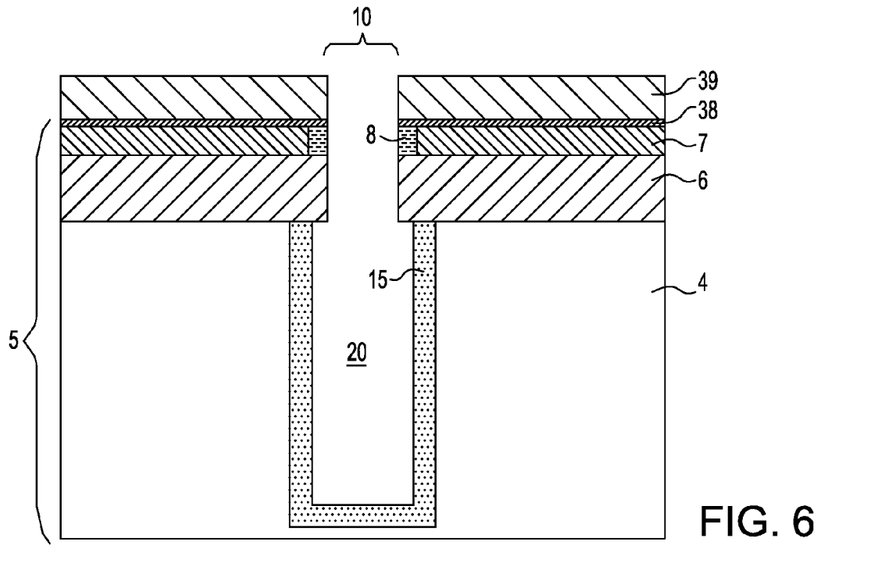
FIG. 6 is a side cross-sectional view depicting forming a lower plate electrode of a memory device in the trench, in accordance with one embodiment of the present invention.

FIG. 6 depicts one embodiment of forming a lower electrode 15, e.g., lower plate electrode, of a memory device in the trench 20, i.e, trench memory device, e.g., trench capacitor. In one embodiment, the lower electrode 15 may be formed on the outer sidewalls of the trench 20 via ion implantation of n-type or p-type dopants into the second semiconductor layer 4 of the semiconductor substrate 5 to provide a buried plate diffusion region. In one example, the lower electrode 15 may be provided by an N+ buried plate diffusion region that is formed about, i.e., within, the exterior walls of the at least one trench 20 using a process that is capable of diffusing N+ dopant through the trench walls. Producing the N+ buried plate diffusion region may begin with introducing a dopant source to the sidewalls of the at least one trench 20 and then thermally diffusing the dopant into the second semiconductor layer 4 of the semiconductor substrate 5.

The dopant source to produce the N+ buried plate diffusion region may be introduced by ion-implanting an impurity, such as arsenic (As) or phosphorus (P), into the sidewall of the trench 20. Arsenic (As) may be ion-injected into the trench 20 under the conditions of an accelerating voltage, of about 40 kV, and at a dose of about $10^{15}/cm^2$. Depositing a layer of N-type doped material, such as arsenic doped silicate glass, may also form the N+ buried plate diffusion region. After the impurities are introduced to the sidewalls of the at least one trench 20, the semiconductor substrate 5 including the second semiconductor layer 4 is then heated in an $N_2$ atmosphere at a temperature of about 900° C. for about 30 minutes, thereby diffusing N-type dopants into the second semiconductor layer 4 and forming a N-type impurity buried plate diffusion region around the sidewalls of the trench 20.

In another embodiment, a gaseous doping source such as $AsH_3$ or plasma doping source may also be used to dope the sidewall of the trench 20 in the second semiconductor layer 4 of the semiconductor substrate 5 to provide the lower electrode 15.

In another embodiment, the lower electrode 15 is provided on the sidewall and base of trench 20 by a conformally deposited metal nitride layer. The conformally deposited metal nitride layer may be composed of titanium nitride (TiN), tantalum nitride (TaN), tantalum silicon nitride (TaSiN), tungsten nitride (WN) or a combination thereof. The width of the conformally deposited metal nitride layer that provides the lower electrode 15 may range from 3 nm to 30 nm, as measured from the sidewall of the at least one trench 20. More typically, the width of the conformally deposited metal nitride layer that provides the lower electrode 15 may have a thickness of about 10 nm.

The conformally deposited metal nitride layer for the lower electrode 15 may be provided using chemical vapor deposition (CVD). Chemical vapor deposition (CVD) is a deposition process in which a deposited species is formed as a result of a chemical reaction between gaseous reactants at greater than room temperature, wherein solid product of the reaction is deposited on the surface on which a film, coating, or layer of the solid product is to be formed. Variations of CVD processes suitable for providing the conformally deposited metal nitride layer of the lower electrode 15 include, but are not limited to: Atmospheric Pressure CVD (APCVD), Low Pressure CVD (LPCVD), Plasma Enhanced CVD (EPCVD), Metal-Organic CVD (MOCVD), and combinations thereof. In another embodiment, the conformally deposited metal nitride layer for the lower electrode 15 is provided by atomic layer deposition (ALD). Atomic layer deposition (ALD) is a self-limiting, sequential surface chemistry deposition method that deposits conformal thin-films of materials. Atomic layer deposition (ALD) is similar in chemistry to chemical vapor deposition (CVD), except that the ALD reaction may break the CVD reaction into two half reactions, keeping the precursor materials separate during the reaction.

In another embodiment, the dopant source to provide the lower electrode 15 is arsenic or phosphorous doped silicon dioxide glass, or arsenic or phosphorous doped polycrystalline silicon that is deposited along the trench sidewalls. The dopant then driven-in to form an n+ doping region into the second semiconductor layer 4 around the trench 20 from the arsenic doped silicon dioxide glass.

The width of the lower electrode 15 may range from 25 nm to 100 nm, as measured from the sidewall of the trench 20. In one example, the width of the lower electrode 15 has a thickness of about 50 nm, as measured from the sidewall of the trench 20.

Figure 7A:
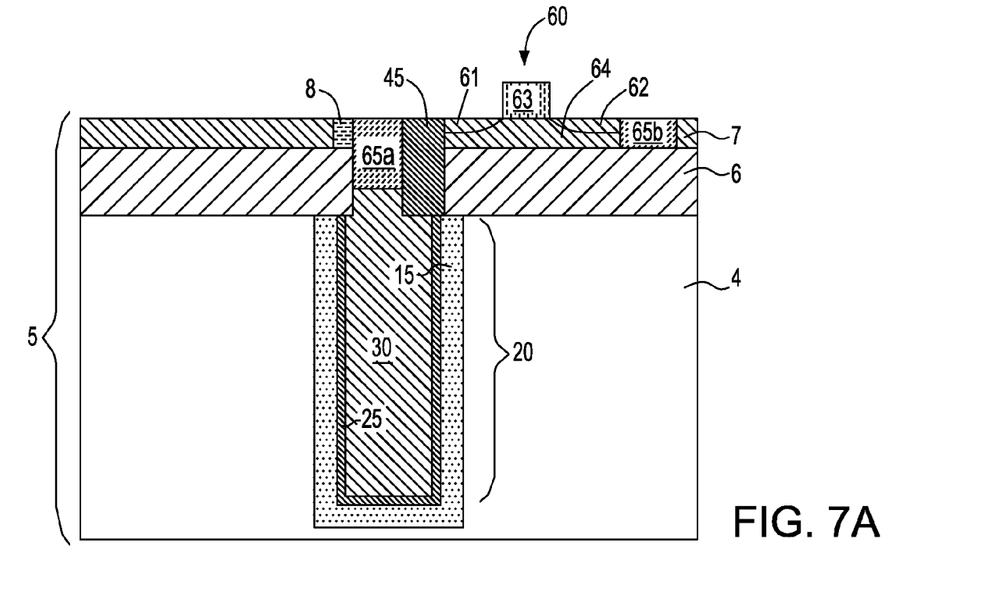
FIG. 7A is a side cross-sectional view along section line A-A of FIG. 7C.
Figure 7B:
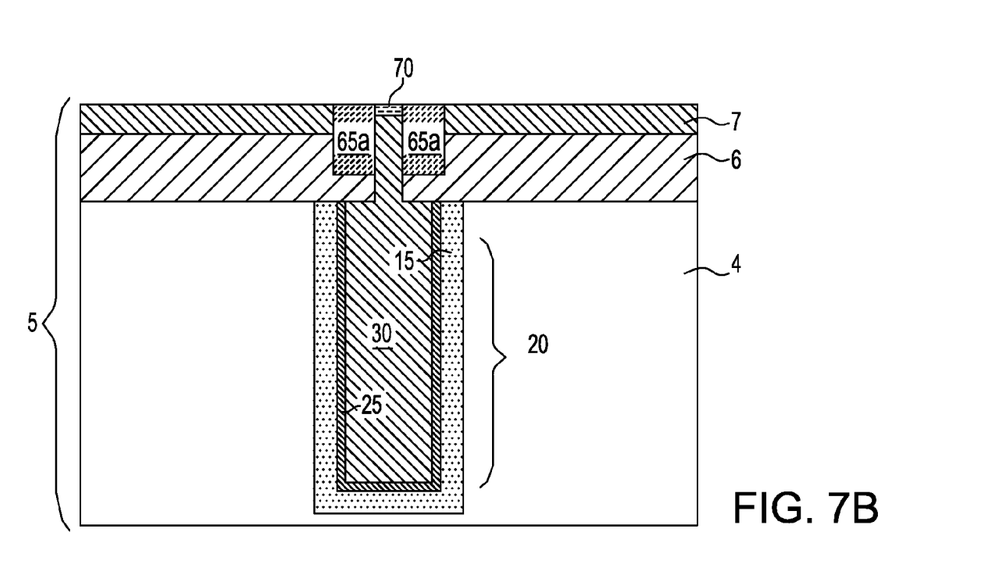
FIG. 7B is a side cross-sectional view along section line B-B of FIG. 7C.
Figure 7C:
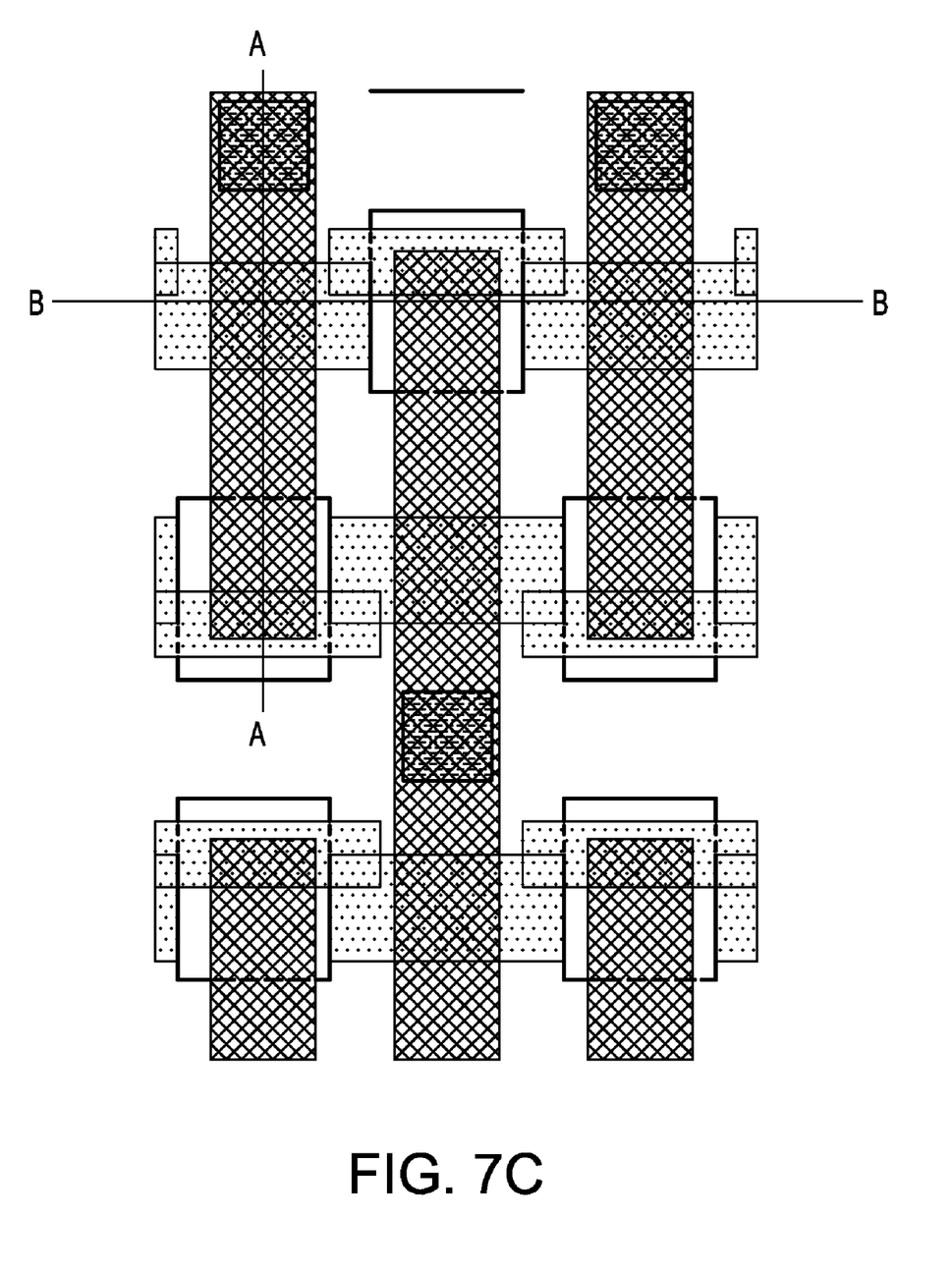
FIG. 7C is a top planar view.

Referring to FIGS. 7A-7C, and following the formation of the lower electrode 15, a conformal dielectric layer is formed on the lower electrode 15 to provide a node dielectric 25 of a memory structure that is formed within the trench 20. The conformal dielectric layer employed at this stage may be any dielectric material including, but not limited to $Si_3N_4$, $SiO_2$, $Al_2O_3$, $ZrO_2$, and $HfO_2$. In one embodiment, the conformal dielectric layer may have a thickness of from 4.0 nm to 10.0 nm. The conformal dielectric layer may have a thickness of from 2.5 nm to 7.0 nm, with a thickness of from 3.0 nm to 5.0 nm being more typical.

The node dielectric 25 is conformally deposited on the sidewalls and base of the trench 20 or directly on a conformal metal nitride layer. In one embodiment, the node dielectric 25 may be deposited using chemical vapor deposition (CVD). Variations of CVD processes suitable for providing the node dielectric include, but are not limited to: Atmospheric Pressure CVD (APCVD), Low Pressure CVD (LPCVD), Plasma Enhanced CVD (EPCVD), Metal-Organic CVD (MOCVD), atomic layer deposition, and combinations thereof. In another embodiment, the node dielectric 25 is formed using a growth process, such as thermal oxidation.

Following the formation of the node dielectric 25, an upper electrode 30 is formed atop the node dielectric 25. The upper electrode 30 is composed of a conductive material, such as doped polysilicon or a metal. In one embodiment, the conductive material of the upper electrode 30 may be comprised of polysilicon, doped polysilicon, titanium nitride (TiN), tantalum nitride (TaN), tantalum silicon nitride (TaSiN), tungsten nitride (WN) or a combination thereof In the embodiments in which the conductive material is provided by doped polysilicon, the dopant may be an n-type or p-type dopant having a dopant concentration ranging from $1 \times 10^{18}$ atoms/$cm^3$ to $1 \times 10^{20}$ atoms/$cm^3$. The conductive material for the upper electrode 30 may be deposited using physical vapor deposition (PVD), such as plating or sputtering, or may be deposited using chemical vapor deposition (CVD). The upper electrode is deposited to fill the trench 20 and the opening.

Following deposition, and in one embodiment, the conductive material of the upper electrode 30 may be recessed into the trench 20, in some instances below an upper surface of the buried dielectric layer 6. The conductive material may be recessed with an anisotropic etch process, such as reactive ion etch (RIE). In one embodiment, the conductive material is recessed below the upper surface of the buried dielectric layer 6 of the semiconductor substrate 5.

In a following process sequence, the node dielectric 25 that extends above the recessed conductive material of the upper electrode 30 is recessed below the upper surface of the conductive material. In one embodiment, the step of etching the node dielectric 25 includes an etch process that removes the material of the node dielectric 25 selective to the conductive material of the upper electrode 30.

Thereafter, a doped polysilicon region 45 (also referred to as strap region) is formed atop the recessed conductive material of the upper electrode 30, which provides for electrical communication between the upper electrode 30 of the trench memory device and the subsequently formed pass transistors 60.

In one embodiment, prior to forming the doped polysilicon region 45, the protective oxide 8 is removed from at least one side the first semiconductor layer 7. In one example, the protective oxide 8 is removed using an anisotropic etch process in combination with an etch mask. For example, a photolithographic mask (not shown) may provide an etch mask by applying a photoresist layer (not shown) on the surface to be etched utilizing a conventional deposition process. The photoresist layer is then patterned utilizing conventional lithography so as to expose selected regions to be etched. In one embodiment, the photolithographic mask is formed overlying a portion of the protective oxide 8 on one side of the trench, wherein a remaining portion of the protective oxide 8 is not underlying the photolithographic mask and may be exposed. In the embodiments in which a portion of the protective oxide 8 is exposed, the remaining layers of the pad dielectric stack have been removed. The remaining layers of the pad dielectric stack may be removed by selective etch or chemical strip methods. In this embodiment, in which the pad dielectric stack has been removed prior to the removal of a portion of the protective oxide 8, the etch process step removes the exposed portion of the protective oxide 8, wherein the portion of the protective oxide 8 that is underlying the photolithographic mask is protected from the etch process and remains. The etching process for removing the protective oxide 8 may include reactive-ion etching (RIE), ion beam etching, plasma etching or laser ablation.

In another embodiment, the pad dielectric stack is removed after the portion of the protective oxide 8 has been removed. In this embodiment, the pad dielectric stack may function as a hard mask. More specifically, the different dielectric layers of the pad dielectric stack, in combination with the photolithography mask and selective etching may be utilized in a multi-stage etch process to remove the protective oxide 8 from one side of the trench 20. In this embodiment, the portion of the pad dielectric stack overlying the portion of the protective oxide 8 that is to be removed is etched first to expose the protective oxide 8. Thereafter, the remaining portion of the pad dielectric stack functions as an etch mask while the exposed portion of the protective oxide 8 is removed. Following the removal of the portion of the protective oxide 8, the remaining layers of the pad dielectric stack may be removed.

In a following process sequence, the doped polysilicon region 45 is formed in physical contact with the sidewall of the first semiconductor layer 7 from which the protective oxide 8 was removed. In one embodiment, the doped polysilicon region 45 is formed by first depositing a layer of polysilicon atop the recessed conductive material of the upper electrode 30, and then doping the polysilicon layer via ion implantation. The polysilicon layer may be deposited using chemical vapor deposition (CVD). The polysilicon layer that provides the doped polysilicon region 45 may then be doped by ion implantation with an n-type or p-type dopant. A typical implant dose for providing the doped polysilicon region 45 is from $1 \times 10^{15}$ $cm^{-2}$ to $5 \times 10^{16}$ $cm^2$. A typical implant energy range for providing the doped polysilicon region 45 is from 1 to 20 keV. In one embodiment, the doped polysilicon region 45 provides for electrical communication between the upper electrode 30 of the memory devices contained within the trench and the subsequently formed pass transistors 60.

Referring to FIG. 7A, in one embodiment, an isolation region 65a, such as a trench top oxide (TTO), is formed overlying the trench memory devices, e.g. trench capacitor. Forming the isolation region 65a may include an etch process to remove a portion of the doped polysilicon region 45 followed by deposition of an insulating material, such as an oxide, nitride, or oxynitride material. It is noted that in addition to the isolation region 65a that is present overlying the trench memory device, e.g., trench capacitor, other isolation regions 65b may simultaneously be formed through the first semiconductor layer 7. Referring to FIG. 7B, in one embodiment, a further insulating material 70 may be present overlying the upper electrode 30.

Referring to FIG. 7A, in a following process sequence, pass transistors 60 are formed on the first semiconductor layer 7 in electrical communication with the trench memory devices, e.g., trench capacitors. In one embodiment, the pass transistors 60 are field effect transistors (FETs), such as n-type and/or p-type FETs. Each field effect transistor (FET) may include a source region 61, a drain region 62, and a gate structure 63, in which a channel region 64 is present underlying the gate structure 63 and is present between the source region 61 and the drain region 62. Typically, the pass transistors 60 are planar devices, in which the length of the channel 64 is parallel to the upper surface of the first semiconductor layer 7, e.g. SOI layer, in which the pass transistor 60 is formed. Typically, at least one of the source region 61 and the drain region 62 of the pass transistors 60 are in electrical communication with the upper electrode 30 of the trench memory device, e.g. trench capacitor, through the doped polysilicon region 45.

Referring to FIG. 7A, and in one embodiment, a memory device is provided that includes a semiconductor on insulator (SOI) substrate (semiconductor substrate 5) including a first semiconductor layer 7 atop a buried dielectric layer 6, wherein the buried dielectric layer 6 is overlying a second semiconductor layer 4; a capacitor 15, 25, 30 present in a trench 20, wherein the trench 20 extends from an upper surface of the first semiconductor layer 7 through the buried dielectric layer 6 and extends into the second semiconductor layer 4, wherein a protective oxide 8 is present on at least one sidewall of the trench 20 at which the first semiconductor layer 7 is present; and a pass transistor 60 present atop the semiconductor on insulator (SOI) substrate 5 is in electrical communication with the capacitor 15, 25, 30.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described our invention in detail, what we claim is new and desire to secure by the Letters Patent is:

1. A method for forming a memory device comprising:
    forming at least one dielectric layer on an upper surface of a semiconductor on insulator (SOI) substrate, the SOI substrate includes a first semiconductor layer overlying a buried dielectric layer, in which the buried dielectric layer is overlying a second semiconductor layer, wherein the at least one dielectric layer has an opening that provides an exposed portion of the semiconductor on insulator (SOI) substrate;
    etching the exposed portion of the SOI substrate to expose at least a sidewall of the first semiconductor layer;
    laterally etching the sidewall of the first semiconductor layer to provide a void underlying the at least one dielectric layer;
    oxidizing the sidewall of the first semiconductor layer to fill at least a portion of the void, wherein an oxide containing material formed by the oxidizing of the sidewall of the first semiconductor layer does not extend outside the void formed by the laterally etching of the sidewall of the first semiconductor layer, and does not extend beyond an edge of the at least one dielectric layer that the void is underlying;
    forming a trench into the second semiconductor layer extending from the first semiconductor layer through the buried dielectric layer and into at least a portion of the second semiconductor layer; and
    forming at least one electrode in a portion of the trench present in the second semiconductor layer.

2. The method of claim 1, wherein the forming of the at least one electrode comprises ion implantation of n-type or p-type dopants into the semiconductor on insulator (SOI) substrate.

3. The method of claim 1, wherein the etching the exposed portion of the SOI substrate to expose at least the sidewall of the first semiconductor layer comprises an anisotropic etch process that etches the first semiconductor layer selective to the at least one dielectric layer on the upper surface of the SOI substrate and is selective to the buried dielectric layer.

4. The method of claim 1, wherein the lateral etching the sidewall of the first semiconductor layer to provide the void comprises an isotropic etch.

5. The method of claim 1, wherein the void has a width ranging from 2nm to 10 nm, as measured from an original sidewall of the trench.

6. The method of claim 1, wherein the laterally etching of the sidewall of the first semiconductor layer to provide the void comprises a wet isotropic etch that removed the first semiconductor layer selective to the buried dielectric layer.

7. The method of claim 1, wherein the oxidizing of the sidewall of the first semiconductor layer comprises a thermal oxidation process.

8. The method of claim 1, wherein the forming of the trench into the second semiconductor layer includes an anisotropic etch though the buried dielectric layer to a first depth into the second semiconductor layer using at least a portion of the at least one dielectric layer as an etch mask; and an isotropic etch to widen the trench in the second semiconductor layer.

* * * * *